(12) United States Patent
Wang et al.

(10) Patent No.: US 12,237,186 B2
(45) Date of Patent: Feb. 25, 2025

(54) ON-BOARD CLEANING OF TOOLING PARTS IN HYBRID BONDING TOOL

(71) Applicant: Applied Materials, Inc., Santa Clara, CA (US)

(72) Inventors: Ruiping Wang, San Jose, CA (US); Ying Wang, Singapore (SG); Guan Huei See, Singapore (SG); Ananthkrishna Jupudi, Singapore (SG); Praveen Kumar Choragudi, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/945,910

(22) Filed: Sep. 15, 2022

(65) Prior Publication Data

US 2024/0096664 A1    Mar. 21, 2024

(51) Int. Cl.
| | | |
|---|---|---|
| *H01L 21/67* | (2006.01) |
| *B08B 1/10* | (2024.01) |
| *B08B 3/04* | (2006.01) |
| *B08B 7/00* | (2006.01) |
| *B08B 13/00* | (2006.01) |
| *F26B 25/14* | (2006.01) |
| *G06T 1/00* | (2006.01) |
| *H01L 21/683* | (2006.01) |

(52) U.S. Cl.
CPC .......... *H01L 21/67207* (2013.01); *B08B 1/10* (2024.01); *B08B 3/04* (2013.01); *B08B 7/0035* (2013.01); *B08B 13/00* (2013.01); *F26B 25/14* (2013.01); *G06T 1/0014* (2013.01); *H01L 21/67144* (2013.01); *H01L 21/6838* (2013.01)

(58) Field of Classification Search
CPC ......... H01L 21/67207; H01L 21/67144; H01L 21/6838; B08B 1/001; B08B 3/04; B08B 7/0035; B08B 13/00; F26B 25/14; G06T 1/0014
See application file for complete search history.

(56) References Cited

U.S. PATENT DOCUMENTS

| | | | | |
|---|---|---|---|---|
| 7,236,847 B2 * | 6/2007 | Marella | ................... | H01L 22/20 |
| | | | | 205/82 |
| 9,646,817 B2 * | 5/2017 | Rebstock | .................. | B08B 3/12 |
| 10,294,098 B2 | 5/2019 | Lin et al. | | |

(Continued)

OTHER PUBLICATIONS

International Search Report for PCT/US2023/032822, dated Jan. 4, 2024.

*Primary Examiner* — Sharidan Carrillo
(74) *Attorney, Agent, or Firm* — Moser Taboada

(57) ABSTRACT

Methods and apparatus for cleaning tooling parts in a substrate processing tool are provided herein. In some embodiments, a method of cleaning tooling parts in a substrate processing tool includes placing one or more dirty tools on a holder in a bonding chamber of a multi-chamber processing tool; transferring the holder from the bonding chamber to a cleaning chamber of the multi-chamber processing tool; cleaning the one or more dirty tools in the cleaning chamber to produce one or more cleaned tools; inspecting the one or more cleaned tools in an inspection chamber of the multi-chamber processing tool; and transferring the one or more cleaned tools to the bonding chamber.

14 Claims, 3 Drawing Sheets

(56) References Cited

U.S. PATENT DOCUMENTS

| | | | |
|---|---|---|---|
| 2003/0181123 A1* | 9/2003 | Lee | B32B 37/10 |
| | | | 445/25 |
| 2004/0045574 A1* | 3/2004 | Tan | B08B 3/08 |
| | | | 134/1 |
| 2004/0099285 A1* | 5/2004 | Wang | C23F 1/36 |
| | | | 134/8 |
| 2005/0172984 A1* | 8/2005 | Schweitzer | C23C 16/4407 |
| | | | 134/26 |
| 2009/0139540 A1* | 6/2009 | Lau | B08B 7/0035 |
| | | | 134/1.1 |
| 2012/0118510 A1* | 5/2012 | Banda | B32B 38/10 |
| | | | 156/704 |
| 2012/0325271 A1 | 12/2012 | Rebstock | |
| 2014/0144462 A1 | 5/2014 | Verhaverbeke et al. | |
| 2015/0031189 A1 | 1/2015 | Chen et al. | |
| 2016/0079096 A1* | 3/2016 | Avoyan | H01L 21/02054 |
| | | | 134/40 |
| 2017/0129180 A1 | 5/2017 | Coates et al. | |
| 2017/0207191 A1* | 7/2017 | Huang | B23K 20/26 |
| 2019/0148333 A1* | 5/2019 | Chen | H01L 24/94 |
| | | | 438/16 |
| 2020/0075371 A1* | 3/2020 | Kuo | H01L 21/67051 |
| 2020/0331035 A1* | 10/2020 | Chung | B08B 1/20 |
| 2021/0141014 A1* | 5/2021 | Kwon | G01R 31/2894 |
| 2022/0093374 A1* | 3/2022 | Son | H01L 21/67769 |
| 2022/0152661 A1 | 5/2022 | Park et al. | |
| 2022/0344197 A1* | 10/2022 | Chang | H01L 21/67092 |
| 2023/0067346 A1* | 3/2023 | Chen | H01L 21/67092 |
| 2023/0135865 A1* | 5/2023 | Rebstock | B08B 3/12 |
| | | | 134/22.18 |
| 2023/0182181 A1* | 6/2023 | Peng | H01L 21/67389 |
| | | | 134/19 |
| 2023/0260955 A1* | 8/2023 | Wang | H01L 24/80 |
| | | | 438/15 |

* cited by examiner

ON-BOARD CLEANING OF TOOLING PARTS IN HYBRID BONDING TOOL

FIELD

Embodiments of the present disclosure generally relate to substrate processing equipment.

BACKGROUND

Wafer bonding is a packaging technology on wafer-level for the fabrication of integrated circuits. Hybrid bonding is a type of wafer bonding technique where a bonding interface has two types of materials, such as a dielectric material and a metal material. Wafer to wafer (W2W) hybrid bonding or chip on wafer (CoW) hybrid bonding are common hybrid bonding techniques. CoW hybrid bonding consists of bonding individual dies on the wafer. A bonding chamber may include tooling configured to pick, flip, place, and bond the dies to the wafer. However, tooling parts of the bonding chamber can get dirty and cause defects to propagate to multiple subsequent dies being processed. Taking out the dirty parts for cleaning with tight particle and organic contamination control may take a few days or more, thereby reducing processing throughput. Additionally, such cleaning may require a significant amount of additional parts to manage.

Accordingly, the inventors have provided improved methods and apparatus for in-situ cleaning of tooling parts in a hybrid bonding tool.

SUMMARY

Methods and apparatus for cleaning tooling parts in a substrate processing tool are provided herein. In some embodiments, a method of cleaning tooling parts in a substrate processing tool includes placing one or more dirty tools on a holder in a bonding chamber of a multi-chamber integrated tool, or processing tool; transferring the holder from the bonding chamber to a cleaning chamber of the multi-chamber processing tool; cleaning the one or more dirty tools in the cleaning chamber to produce one or more cleaned tools; inspecting the one or more cleaned tools in an inspection chamber of the multi-chamber processing tool; and transferring the one or more cleaned tools to the bonding chamber.

In some embodiments, a non-transitory computer readable medium comprising one or more processors, that when executed, perform a method of cleaning tooling parts in a substrate processing tool, includes: placing a dirty tool on a holder in a bonding chamber of a multi-chamber processing tool; transferring the holder from the bonding chamber to a cleaning chamber of the multi-chamber processing tool; cleaning the dirty tool in the cleaning chamber to produce a cleaned tool; inspecting the cleaned tool in an inspection chamber of the multi-chamber processing tool; and transferring the cleaned tool to the bonding chamber.

In some embodiments, a multi-chamber processing tool includes: a factory interface (FI) having one or more loadports for receiving one or more substrates; a transfer chamber coupled to the factory interface; a plurality of process chambers coupled to the transfer chamber, wherein the plurality of process chambers comprise: a bonding chamber having a first tool and a holder configured to hold the first tool when dirty; a cleaning chamber for cleaning the first tool; a drying chamber for drying the first tool; and an inspection chamber for inspecting the first tool; and a transfer robot disposed in the transfer chamber and configured to facilitate shuttling the one or more substrates between the FI and the plurality of process chambers.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
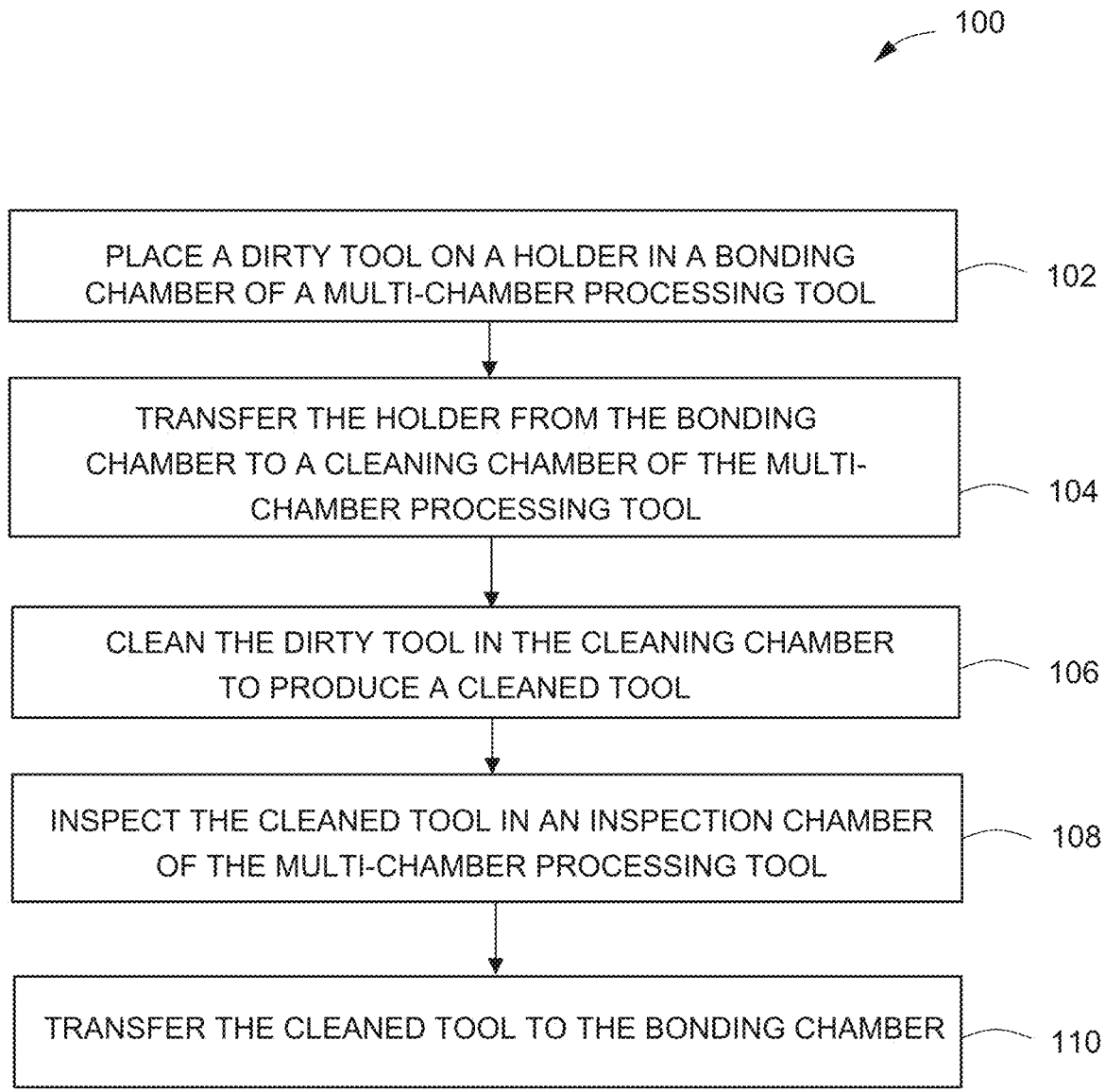
FIG. 1 depicts a flow chart of a method of cleaning tooling parts in a substrate processing tool in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for in-situ cleaning of tooling parts are provided herein. For example, in-situ cleaning of tooling parts may be performed in a multi-chamber processing tool. In some embodiments, the multi-chamber processing tool may include a first chamber having a tooling part that needs cleaning, a second chamber configured to clean the tooling part, and a third chamber for inspecting the cleaned tooling part for cleanliness. In-situ cleaning of the dirty tooling parts advantageously allows for quality and quick tooling part replacement with minimal manual handling.

FIG. 1 depicts a flow chart of a method 100 of cleaning tooling parts in a substrate processing tool in accordance with at least some embodiments of the present disclosure. At 102, the method 100 includes placing a dirty tool (e.g., first tool 258) on a holder (e.g., holder 266) in a bonding chamber (e.g., bonding chamber 250) of a multi-chamber processing tool (e.g., multi-chamber processing tool 200). In some embodiments, the dirty tool is a tooling component for use in a bonding chamber, such as a picker tool, a flipper tool, an aligner tool, an ejector tool, or a placer tool of a bonder robot. The dirty tool may be any suitable component that requires periodic cleaning. In some embodiments, a dirty tool is determined via post-bonding inspection such as through acoustic or infrared inspection. The post-bonding inspection may identify propagating voids or relevant bonding quality degradation based on a defects library or other learnings to determine that the tooling is dirty. In some embodiments, a dirty tool is determined without post-bonding inspection, and instead, a periodic clean frequency is set in terms of threshold time and/or a threshold total number of dies bonded, whichever is sooner. In some embodiments, a spare clean tool may be installed for use in the bonding chamber after the dirty tool is removed.

The holder may generally be a circular shaped plate. However, the holder may be any suitable shape such as a polygonal, oval, elongated oval, or the like. In some embodiments, the holder is the same size as a substrate (e.g., first substrate 262, second substrate 264) being processed. In some embodiments, the holder is smaller in size than the substrate being processed. In some embodiments, the holder has a diameter of about 5.8 to about 12.5 inches. The holder may be able to fasten/lock the tooling(s) through mechanical means. The tightness of fastening should be able to hold the tooling(s) in place during the on-board cleaning process. In some embodiment, the locking mechanism is a spring-loaded clip to create the necessary frictional force to hold the tooling in place. In some embodiment, the locking can be created by a latching mechanism.

At 104, the method 100 includes transferring the holder from the bonding chamber to a cleaning chamber (e.g., cleaning chamber 252) of the multi-chamber processing tool. In some embodiments, the holder is transferred from the bonding chamber to the cleaning chamber via a transfer chamber (e.g., transfer chamber 204) of the multi-chamber processing tool. The transfer chamber may be kept at atmospheric pressure. The holder may include one or more dirty tools for single or batch cleaning. In some embodiments, the method 100 includes placing a second dirty tool (e.g., second tool 272) on the holder in the bonding chamber prior to transferring the holder to the cleaning chamber.

At 106, the method 100 includes cleaning the dirty tool in the cleaning chamber to produce a cleaned tool. In some embodiments, the cleaning is performed via a wet clean process, a plasma process, or a mechanical scrubbing process. In some embodiments, the method 100 includes drying the cleaned tool in the multi-chamber processing tool. In some embodiments, the drying is performed in a drying chamber (e.g., drying chamber 254) separate from the cleaning chamber. In some embodiments, the drying is performed via spin drying, blow drying, baking, or vacuum evacuation. In some embodiments, the drying may be performed with injection of a gas in the cleaning chamber or drying chamber such as nitrogen gas. In some embodiments, the drying may be performed without injection of a gas.

At 108, the method 100 includes inspecting the cleaned tool in an inspection chamber (e.g., inspection chamber 256) of the multi-chamber processing tool. In some embodiments, inspecting the cleaned tool is performed via optical or infrared imaging. In some embodiments, inspecting the cleaned tool includes failing inspection and re-cleaning the cleaned tool to produce a re-cleaned tool. For example, in some embodiments, the cleaned tool may be re-cleaned and re-inspected until the cleaned tool passes inspection.

At 110, the method 100 includes transferring the cleaned tool that passes inspection back in the bonding chamber. In some embodiments, the cleaned tool is installed in the bonding chamber. In some embodiments, prior to installing the cleaned tool, the cleaned tool may be placed on a spare holder (e.g., spare holder 268) to be stored until required to be installed for use.

Figure 2:
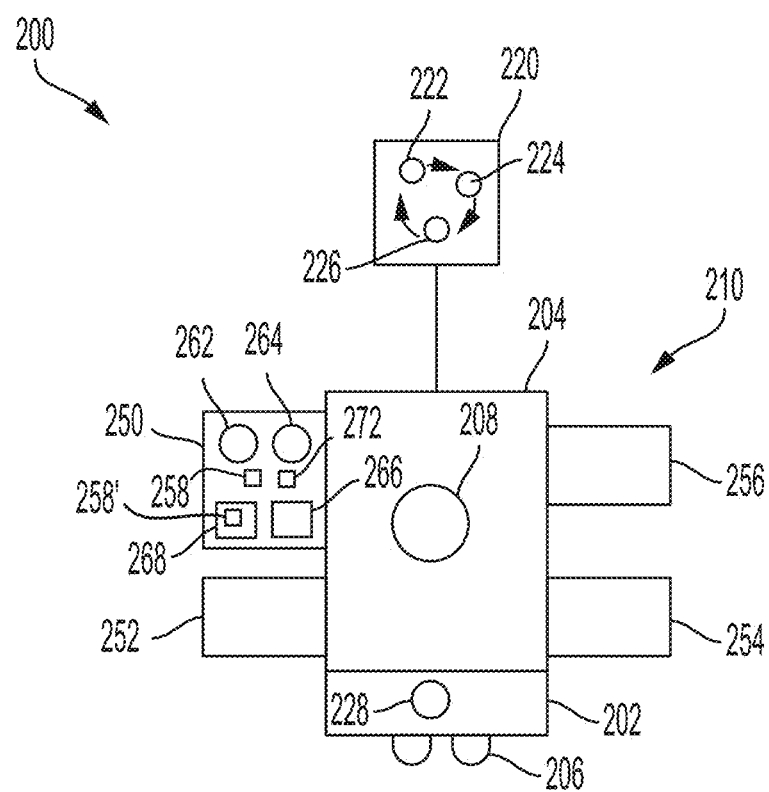
FIG. 2 depicts a multi-chamber processing tool in accordance with at least some embodiments of the present disclosure.

FIG. 2 depicts a multi-chamber processing tool 200 in accordance with at least some embodiments of the present disclosure. The multi-chamber processing tool 200 may be configured for bonding one or more dies to a substrate. In some embodiments, the multi-chamber processing tool 200 includes a factory interface 202 (FI) having one or more loadports 206 for receiving one or more substrates.

The substrates may include 200 mm wafers, 300 mm wafers, 450 mm wafers, carrier substrates, silicon substrates, glass substrates, tape frame substrates that have one or more dies adhered thereto, or the like. A transfer chamber 204 may be coupled to the FI 202. The FI 202 may include a FI robot 228 for transferring substrates from the one or more loadports 206 to the transfer chamber 204. The plurality of process chambers 210 may be sealingly engaged with the transfer chamber 204 to perform the processes described herein.

As depicted in FIG. 2, a transfer robot 208 is generally housed in the transfer chamber 204 and configured to transport substrates between the FI 202 and the plurality of process chambers 210 and between the plurality of process chambers 210. The plurality of process chambers 210 may include atmospheric chambers that are configured to operate under atmospheric pressure and vacuum chambers that are configured to operate under vacuum pressure. Examples of the atmospheric chambers may generally include wet clean chambers, anneal chambers, metrology chambers, bonding chambers, drying chambers, or the like. Examples of vacuum chambers may include plasma chambers. The plurality of process chambers 210 may be any process chambers or modules needed to perform a bonding process, a cleaning process, a drying process, an inspection process, or the like.

For example, the plurality of process chambers 210 may include a bonding chamber 250 having a first tool 258 and a holder 266 configured to hold the first tool 258 when dirty. The bonding chamber 250 may include a second tool 272 different than the first tool 258. The holder 266 may be configured to hold the second tool 272. In some embodiments, the holder 266 is configured to hold at least one of the first tool 258 and at least one of the second tool 272. The bonding chamber 250 may also include a first support for supporting a first substrate 262 having a plurality of dies disposed thereon, for example, a tape frame substrate. The bonding chamber 250 may include a second support for supporting a second substrate 264. The second substrate 264 may be the substrate on which the plurality of dies are place on and bonded to in the bonding chamber 250. The first tool 258 and the second tool 272 may be any suitable tool for facilitating bonding the plurality of dies to the second substrate 264. For example, the first tool 258 and second tool 272 may be a picking tool, a flipper tool, an aligning tool, an ejection tool, a placing tool, or the like.

The bonding chamber 250 may include spare first tools 258' on a spare holder 268. The bonding chamber 250 may include spare ones of the second tools 272 on the spare holder 268 or a separate spare holder than the spare holder 268. In use, when the first tool 258 gets dirty, one of the spare first tools 258' may be used in the bonding chamber 250 to facilitate bonding one or more dies to the second substrate 264 while the first tool 258 is getting cleaned, advantageously resulting in minimal process flow interruption and down time and increased throughput. Spare ones of the second tools 272 may be used in a similar manner.

The plurality of process chambers 210 include a cleaning chamber 252 configured to support the holder 266 and to clean one or more of the first tool 258. In some embodiments, the cleaning chamber is a wet clean chamber, a plasma chamber, or a mechanical scrubbing chamber. In some embodiments, the plurality of process chambers 210 include a drying chamber 254 configured to support the holder and to dry one or more of the first tool 258. In some embodiments, the drying is performed via spin drying, blow drying, baking, or vacuum evacuation. In some embodiments, the cleaning chamber and the drying chamber are the same chamber. In a non-limiting example, the cleaning chamber 252 can perform a wet clean process and a spin-drying process. The transfer robot 208 may be configured to transfer the holder 266 from the bonding chamber 250 to the cleaning chamber 252 and from the cleaning chamber 252 to the bonding chamber 250.

In some embodiments, the plurality of process chambers 210 include an inspection chamber 256 configured for inspecting one or more of the first tool 258. In some embodiments, the inspection chamber 256 is an optical imaging chamber or infrared imaging chamber. In some embodiments, the inspection chamber 256 is configured to track and store cleaning history of each tool inspected therein, via a controller 220 of the multi-chamber processing tool 200, or a stand-alone controller of the inspection chamber 256.

The controller 220 generally controls the operation of the multi-chamber processing tool 200. The controller 220 may use a direct control of the multi-chamber processing tool 200, or alternatively, by controlling the computers (or controllers) associated with the multi-chamber processing tool 200. In operation, the controller 220 enables data collection and feedback from the multi-chamber processing tool 200 to optimize performance of the multi-chamber processing tool 200. The controller 220 generally include a central processing unit (CPU) 222 comprising one or more processors, a memory 224, and a support circuit 226. The CPU 222 may be any form of a general-purpose computer processor that can be used in an industrial setting. The support circuit 226 is conventionally coupled to the CPU 222 and may comprise a cache, clock circuits, input/output subsystems, power supplies, and the like. Software routines, such as a method as described below may be stored in the memory 224 and, when executed by the CPU 222, transform the CPU 222 into a specific purpose computer (controller 220). The software routines may also be stored and/or executed by a second controller (not shown) that is located remotely from the multi-chamber processing tool 200.

The memory 224 may be in the form of a non-transitory computer-readable storage media that contains instructions, when executed by the CPU 222, to facilitate the operation of multi-chamber processing tool 200. The instructions in the memory 224 may be in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 3:
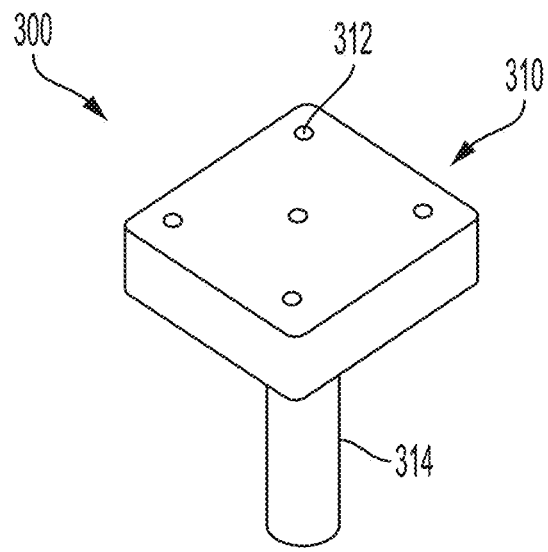
FIG. 3 depicts a tooling part in accordance with at least some embodiments of the present disclosure.

FIG. 3 depicts a tooling part 300 in accordance with at least some embodiments of the present disclosure. In some embodiments, the tooling part 300 is the first tool 258. In some embodiments, the tooling part 300 is used in the bonding chamber 250 to pick, place, flip, align, or eject dies. The tooling part 300 may include a nozzle head 310 coupled to a shaft 314. In some embodiments, the nozzle head 310 includes one or more vacuum openings 312. In some embodiments, the tooling part 300 is configured to selectively retain a die against the nozzle by applying a vacuum suction via the one or more vacuum openings 312 that are in fluid communication with a central opening of the shaft 314.

Figure 4:
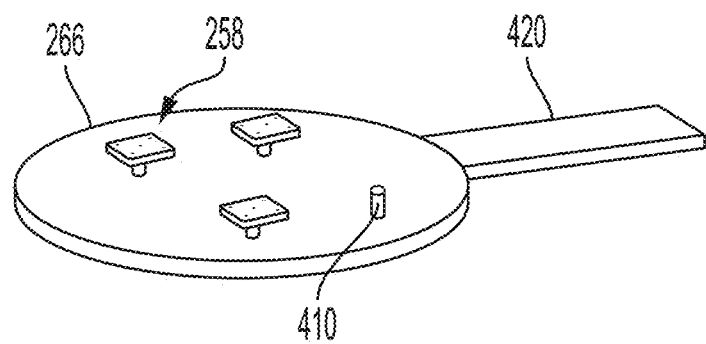
FIG. 4 depicts a holder holding a plurality of dirty tools in accordance with at least some embodiments of the present disclosure.

FIG. 4 depicts a holder 266 holding a plurality of dirty tools in accordance with at least some embodiments of the present disclosure. In some embodiments, at least one of the plurality of dirty tools includes the first tool 258. The holder 266 may include any suitable features configured to hold or retain the plurality of dirty tools, such as tabs, pins, clamps, grooves, or the like. For example, in some embodiments, as depicted in FIG. 4, the holder 266 includes one or more pins 410 configured to retain the first tool 258, for example, by extending into the shaft 314 of the tooling part 300. In some embodiments, the transfer robot 208 includes an end effector 420 configured to hold and transfer the holder 266 between the plurality of process chambers 210.

While the foregoing is directed to embodiments of the present disclosure, other and further embodiments of the disclosure may be devised without departing from the basic scope thereof.

The invention claimed is:

1. A method of cleaning one or more dirty tools in a multi-chamber processing tool, comprising:
   providing one or more dirty tools comprising a nozzle head with a shaft coupled to the nozzle head, the nozzle head having one or more vacuum openings to retain a die against the nozzle head;
   providing a holder in a bonding chamber of the multi-chamber processing tool, the holder comprising one or more pins to retain the one or more dirty tools;
   placing the one or more dirty tools on the holder in the bonding chamber, wherein the bonding chamber further comprises a first substrate having a plurality of dies and a second substrate, and wherein the bonding chamber is used to bond one or more dies of the plurality of dies to the second substrate;
   transferring the holder from the bonding chamber to a cleaning chamber of the multi-chamber processing tool via a transfer robot disposed in the multi-chamber processing tool;
   cleaning the one or more dirty tools in the cleaning chamber to produce one or more cleaned tools;
   inspecting the one or more cleaned tools in an inspection chamber of the multi-chamber processing tool; and
   transferring the one or more cleaned tools from the inspection chamber to the bonding chamber via the transfer robot.

2. The method of claim 1, wherein the holder is transferred from the bonding chamber to the cleaning chamber via a transfer chamber of the multi-chamber processing tool, wherein the transfer chamber is coupled to the bonding chamber, the cleaning chamber, and the inspection chamber.

3. The method of claim 1, further comprising drying the one or more cleaned tools in the multi-chamber processing tool, wherein the drying is performed in a drying chamber separate from the cleaning chamber or wherein the drying is performed via spin drying, blow drying, baking, or vacuum evacuation.

4. The method of claim 1, wherein the cleaning is performed via a wet clean process, a plasma process, or a mechanical scrubbing process.

5. The method of claim 1, wherein the one or more dirty tools comprise a plurality of dirty tools.

6. The method of claim 1, wherein inspecting the one or more cleaned tools includes failing inspection and further comprising:
re-cleaning the one or more cleaned tools to produce a re-cleaned tool.

7. The method of claim 1, wherein inspecting the one or more cleaned tools is performed via optical or infrared imaging.

8. The method of claim 1, further comprising performing a post-bonding inspection of the one or more dirty tools prior to placing the one or more dirty tools on the holder.

9. The method of claim 1, wherein the bonding chamber comprises a spare holder.

10. The method of claim 9, further comprising placing the one or more cleaned tools on the spare holder after transferring from the inspection chamber.

11. A non-transitory computer readable medium comprising one or more processors, that when executed, perform a method of cleaning a dirty tool in a multi-chamber processing tool, comprising:
providing one or more dirty tools comprising a nozzle head with a shaft coupled to the nozzle head, the nozzle head having one or more vacuum openings to retain a die against the nozzle head;
providing a holder in a bonding chamber of the multi-chamber processing tool, the holder comprising one or more pins to retain the one or more dirty tools;
placing the one or more dirty tools on the holder in the bonding chamber, wherein the bonding chamber further comprises a first substrate having a plurality of dies and a second substrate, and wherein the bonding chamber is used to bond one or more dies of the plurality of dies to the second substrate;
transferring the holder from the bonding chamber to a cleaning chamber of the multi-chamber processing tool via a transfer robot disposed in the multi-chamber processing tool;
cleaning the one or more dirty tools in the cleaning chamber to produce one or more cleaned tools;
inspecting the one or more cleaned tools in an inspection chamber of the multi-chamber processing tool; and
transferring the one or more cleaned tools from the inspection chamber to the bonding chamber via a transfer robot.

12. The non-transitory computer readable medium of claim 11, further comprising drying the one or more cleaned tools in the multi-chamber processing tool.

13. The non-transitory computer readable medium of claim 11, wherein the cleaning is performed via a wet clean process, a plasma process, or a mechanical scrubbing process.

14. The non-transitory computer readable medium of claim 12, wherein drying is performed via spin drying, blow drying, baking, or vacuum evacuation.

* * * * *